US009268216B2

(12) United States Patent
Peijster et al.

(10) Patent No.: US 9,268,216 B2
(45) Date of Patent: Feb. 23, 2016

(54) PROJECTION SYSTEM WITH FLEXIBLE COUPLING

(75) Inventors: Jerry Johannes Martinus Peijster, Maartensdijk (NL); Michel Pieter Dansberg, Berkel en Rodenrijs (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 591 days.

(21) Appl. No.: 13/607,471

(22) Filed: Sep. 7, 2012

(65) Prior Publication Data
US 2013/0070223 A1 Mar. 21, 2013

Related U.S. Application Data

(60) Provisional application No. 61/532,636, filed on Sep. 9, 2011.

(51) Int. Cl.
*G03B 27/42* (2006.01)
*G03F 7/00* (2006.01)
(Continued)

(52) U.S. Cl.
CPC ............... *G03F 7/0002* (2013.01); *B82Y 10/00* (2013.01); *B82Y 40/00* (2013.01); *G02B 7/003* (2013.01); *G03F 7/709* (2013.01);
(Continued)

(58) Field of Classification Search
CPC . G03F 7/70241; G03F 7/709; G03F 7/70725; G03F 7/70058; G03F 7/20; G03F 7/70775; G03F 7/70258; G03F 1/26; G03F 7/70; G03F 7/70141; G03F 7/70716; G03B 27/58
USPC ................................................ 355/53, 72, 77
See application file for complete search history.

(56) References Cited

U.S. PATENT DOCUMENTS

| 2002/0001082 A1 | 1/2002 | Akimoto et al. |
| 2006/0110665 A1 | 5/2006 | Bleeker et al. |

(Continued)

FOREIGN PATENT DOCUMENTS

| EP | 1143492 A1 | 10/2001 |
| EP | 1469348 A1 | 10/2004 |

(Continued)

OTHER PUBLICATIONS

Japanese Office Action with English Language Translation, dated Oct. 6, 2015, Japanese Application No. 2014-529635.

*Primary Examiner* — Mesfin T Asfaw
(74) *Attorney, Agent, or Firm* — Blakely Sokoloff Taylor & Zafman LLP

(57) ABSTRACT

The invention relates to a projection system for projecting one or more beams on a target, said system comprising a frame, a projection module comprising a beam source for providing the one or more beams, projection optics for projecting beams on the target, a target positioning module, comprising a carrier for carrying the target, a stage for carrying and positioning the carrier, a measurement system for determining a position of the projection module relative to the carrier, a controller adapted for controlling the target positioning module to position the target under the projection module based on said determined position, wherein the projection module is connected to the frame via a flexible coupling for dampening the propagation of vibrations from said frame to said projection module, and wherein the controller is adapted control the target positioning module to compensate for residual vibrations as measured by said measurement system.

30 Claims, 3 Drawing Sheets

(51) Int. Cl.
 *G02B 7/00* (2006.01)
 *G03F 7/20* (2006.01)
 *H01J 37/30* (2006.01)
 *H01J 37/317* (2006.01)
 *B82Y 10/00* (2011.01)
 *B82Y 40/00* (2011.01)

(52) U.S. Cl.
 CPC ........ *G03F 7/70833* (2013.01); *H01J 37/3007* (2013.01); *H01J 37/3177* (2013.01); *H01J 2237/0216* (2013.01)

(56) References Cited

U.S. PATENT DOCUMENTS

2007/0035713 A1 2/2007 Shibayama
2007/0206170 A1* 9/2007 Ebihara ........................... 355/53
2008/0068568 A1 3/2008 Ebihara et al.
2009/0033895 A1* 2/2009 Binnard et al. ................. 355/53
2009/0086178 A1 4/2009 Shibazaki
2009/0268190 A1* 10/2009 Molenaar et al. ............... 355/72
2011/0032496 A1* 2/2011 Shibazaki ....................... 355/30
2011/0174985 A1 7/2011 Peijster

FOREIGN PATENT DOCUMENTS

| | | |
|---|---|---|
| EP | 1577929 A2 | 9/2005 |
| EP | 1975980 | 10/2008 |
| JP | 2006344685 | 12/2006 |
| JP | 2009016412 | 1/2009 |
| JP | 2009088512 | 4/2009 |
| JP | 2014007417 | 1/2014 |
| WO | WO-2007077920 | 7/2007 |

* cited by examiner

PROJECTION SYSTEM WITH FLEXIBLE COUPLING

This is a non-provisional application claiming the benefit of U.S. Provisional Application No. 61/532,636, filed Sep. 9, 2011.

BACKGROUND

The invention relates to a projection system for projecting one or more beams on a target, wherein said system is adapted for reducing the influence of residual vibrations on a position of a projection module of the system relative to the target. Such systems are used in applications such a lithography and microscopy, in which one or beams have to be projected onto a target with high accuracy, e.g. within nanometer accuracy.

European Patent application 1 577 929 describes an electron beam exposure apparatus comprising a column for irradiating a sample with an electron beam, a sample chamber having a vacuum pump, a stage arranged within the sample chamber for holding and moving the sample, and a mounting for elastically supporting the column with respect to the sample chamber. By measuring the relative displacement between an upper partition of the sample chamber and the column as well as the acceleration of the column, and then feedback-controlling an actuator which is provided between the upper partition and the column, a high-frequency component of vibration disturbance from the upper partition is prevented from being transmitted to the column.

The known exposure apparatus has a complex construction, e.g. comprising an actuator between the upper partition of the chamber and the column for preventing high frequency vibrations from being transmitted from the chamber to the column. Moreover, due to the elasticity of the mounting, displacement of the column relative to the frame in a first direction will lead to a build up of elastic potential in the mounting, which in turn will provide a restoring force for displacing the column relative to the chamber in a direction opposite to said first direction later on.

US Patent application 2004/0041101 describes an exposure apparatus including a stage for a target, an electromagnetic actuator for moving the stage, a deflector for deflecting electron beams, a laser interferometer for measuring the position of the stage and a controller which controls the electromagnetic actuator on the basis of measurement results obtained by the laser interferometer, wherein the measurement values are provided to the deflector. To some extend, the effect of residual vibrations may thus be compensated for by altering the amount of deflection provided to the electron beams by the deflector. However, by changing the deflection of the electron beams, the angle of incidence with which the beams strike the target surface is changed, as is the projection of said beams on the target.

Moreover, the prior art apparatus requires communication and controls exchange between different subsystems of the exposure apparatus, significantly complicating the design and development thereof, and hence raising costs of such an apparatus. The prior art apparatus requires communication and controls distribution between a target positioning controller, a stage system, a metrology system and a beam projection system, highly complicating the projection of the beams and the design of the apparatus.

It is an object of the present invention to provide a projection system in which the influence of residual vibrations on the projection of beams onto a target is substantially reduced, wherein preferably said projection system has a reduced complexity in view of the above indicated target positioning functionality.

SUMMARY OF THE INVENTION

According to a first aspect, the present invention provides a projection system for projecting one or more beams on a target, said projection system comprising a frame, a projection module comprising a beam source for providing the one or more beams, and projection optics for projecting the one or more beams on the target, said projection system further comprising a target positioning module, comprising a carrier for carrying the target, and a stage for carrying and positioning the carrier, said projection system further comprising a measurement system for determining a position of the projection module relative to the carrier, and a controller adapted for controlling the target positioning module to position the target under the projection module based on said determined position, wherein the projection module is connected to the frame via a flexible or slack coupling for dampening or preventing the propagation of vibrations from said frame to said projection module, and wherein the controller is adapted to control the target positioning module to compensate for residual vibrations as measured by said measurement system, wherein said flexible coupling is substantially slack along a substantially horizontal plane for allowing movement of the projection module relative to the target positioning module substantially along said horizontal plane. Residual vibrations are typically propagated from the floor on which the projection system rests to the projection system, and may for instance be caused by a nearby person walking on the floor. Advantageously, in the projection system according to the invention, the target positioning module is adapted for displacing the carrier to compensate for measured residual vibrations, while the flexible coupling of the frame to the projection module substantially does not propagate at least a portion of vibrations from the frame to the projection module. The accuracy in positioning of the projection module relative to the carrier and the target thereon is thus improved. By a flexible coupling is meant a coupling which allows movement of the projection module relative to the frame, said coupling preferably being substantially non-elastic, at least in said horizontal plane, e.g. such that a restoring force, i.e. a force which restores the projection module to a substantially neutral position, on the projection module due to gravity is substantially greater than a restoring force due to the elasticity of the flexible coupling. The coupling is preferably flexible or slack along at least two horizontal planes. In an embodiment the flexible coupling may therefore also be interpreted as a flexible and/or slack coupling, in particular in which the coupling is substantially slack along said horizontal plane.

In an embodiment said projection module is substantially completely arranged below said flexible coupling, e.g. below said flexible coupling along the direction of in which gravity pulls the coupling towards the earth. Though the projection module may thus move relatively large distances in the horizontal plane, such movement will be relatively slow and therefore easily compensated by the feedback-control loop formed by the measurement system, the controller and the target positioning module.

In an embodiment said flexible coupling is suspended from said frame in a hanging fashion, preferably such that the optical module hangs free from said frame. As the flexible coupling is thus arranged completely on one side of the frame, e.g. on an inner side of the frame, the frame may be of a simple construction, e.g. without requiring holes for letting through the flexible connection and/or the projection module from one side of the frame to another.

In an embodiment said flexible coupling comprises a flexible portion arranged inside said frame. The flexible portion is preferably completely arranged inside said frame. The flexible coupling may comprise substantially rigid portions as well as flexible and/or slack portions. The flexible and/or slack portions allow movement of the projection module relative to the target positioning module along said substantially horizontal plane.

In an embodiment the projection module comprises a substantially rigid frame to which the flexible coupling is connected. Effects on the accuracy with which the beams are projected onto the target due to elastic and/or flexible deformation of the projection module are thus reduced.

In an embodiment said projection module has a center of mass located substantially closer to said target than to said frame. The closer the center of mass is to the target, the slower the movement of the projection module in said horizontal plane will be, allowing better compensation of said movement, which forms the residual vibrations, by said controller and target positioning module.

In an embodiment said flexible coupling has a first predetermined length along its centerline, wherein said projection module has a second predetermined length along its center line substantially parallel to said centerline of said flexible coupling, wherein said second predetermined length is substantially smaller than said first predetermined length, preferably at least by a factor 4.

In an embodiment the projection system further comprises a vacuum chamber enveloping said frame, projection module, flexible coupling and target positioning system. The vacuum chamber is preferably spaced apart from the frame, e.g. by dampeners, to minimize propagation of vibrations from the vacuum chamber to the frame.

In an embodiment said flexible coupling is or comprises a slack coupling e.g. a coupling with a substantially low stiffness. Such a slack coupling is at least slack in that it allows movement of the projection module relative to said target positioning module along the horizontal plane, by providing a substantially low stiffness along said horizontal plane. However, the slack coupling may also be substantially entirely slack, for instance comprising a cable or rope. By having a low stiffness the slack coupling propagates only distortions, for instance caused by vibrations, below a predetermined threshold, for instance less than 10 Hz or 5 Hz. In this manner, distortions of a higher frequency are effectively dampened by the slack coupling.

In an embodiment, the flexible coupling is substantially non-elastic, i.e. any force on the coupling which causes movement of the projection module relative to the target projection module in said horizontal plane due to elasticity of said coupling is substantially less than a force which causes such movement due to gravity pulling on the coupling and projection module attached there to.

In an embodiment said flexible coupling is substantially rigid along a direction perpendicular to said horizontal plane. Compression or extension of the coupling along a Z axis is thus substantially reduced or avoided altogether.

In an embodiment the flexible coupling is adapted for dampening high frequency vibrations, and the controller is adapted to compensate for residual low frequency vibrations. The target positioning thus only has to correct for relatively slowly occurring errors in relative position between the target carrier and the projection module, such that the target positioning system may move the target carrier at a relatively low velocity to compensate for those errors.

In an embodiment the flexible coupling is adapted for dampening vibrations having a frequency substantially equal to 5 Hz or more, preferably substantially equal to 3.5 Hz or more, more preferably substantially equal to 1 Hz or more.

In an embodiment the carrier is substantially uncoupled from vibrations from the frame to the carrier. Propagation of vibrations from the frame to the carrier is thus substantially reduced or even prevented altogether.

In an embodiment the target positioning module comprises Lorentz-motors for carrying and moving the carrier. Preferably, the carrier is substantially supported by the Lorentz-motors, providing further isolation of vibrations from the frame to the carrier.

In an embodiment the target positioning module is adapted for providing movement of the target relative to the stage in six degrees of freedom to compensate for residual vibrations. Small changes in relative position or rotation of the projection module and the target carrier may thus be compensated for. In particular, changes in the distance between the projection optics of the projection module and the target may thus conveniently be compensated for.

In an embodiment the projection system further comprises dampeners for dampening vibrations from the frame to the flexible coupling and vice versa, wherein the flexible coupling is connected to the frame via said dampeners. The dampeners provide additional dampening of vibrations from the frame to the projection module, in particular of high frequency vibrations along the longitudinal direction of the flexible coupling.

In an embodiment said dampeners comprise one or more leaf springs, preferably arranged for bending within a plane substantially normal to a carrying surface of the carrier.

In an embodiment the flexible coupling comprises a suspension. The projection module thus hangs from the frame by said suspension, and is moveable with respect to the frame in a plane substantially parallel to a target support surface of the target carrier. Preferably the suspension comprises one or more suspension rods, which remain substantially rigid along their longitudinal directions. Changes in distance between projection optics of the projection module and the carrier are thus reduced. For providing the one or more rods with flexibility in a plane normal to their longitudinal directions, the one or more rods are preferably provided with weakened portions, preferably near the ends of said rods. Preferably, the suspension is substantially slack in one or two horizontal planes.

In a preferred embodiment the suspension comprises three substantially parallel suspension rods. The parallel suspension rods form a parallelogram like construction, which substantially constrains the orientation of the projection module relative to the target carrier, i.e. the projection module may be translated relative to the frame, but does not substantially rotate relative to the frame. Preferably the suspension rods are arranged non-coplanarly.

In an embodiment said one or more suspension rods are each formed substantially as a single piece, preferably from a metal such as aluminum, such that no lubrication is needed to facilitate movement of the projection module relative to the frame. The one or more suspension rods may be provided with weakened portions, preferably a weakened portion near each distal end of the rods, for facilitating flexing of the rod around those points.

In an embodiment the suspension is a pendulum suspension having a radial oscillation frequency, wherein said pendulum suspension is adapted for dampening propagation from the frame to the projection module of vibrations having higher frequencies than said radial oscillation frequency. The radial oscillation frequency of a pendulum suspension is substantially constant, making the movement of the projection module relative to the frame highly predictable. As the mass of the projection module is usually known, it is possible to calculate a minimum length for the suspension at which the radial oscillation frequency is less than a predetermined value, e.g. less than 10 Hz or 5 Hz. The greater the length of the suspension is, the lower the radial oscillation frequency will be, though the maximum length of the suspension may be limited e.g. by the size of the frame and/or vacuum chamber in which the suspension is arranged.

In an embodiment the radial oscillation frequency is substantially equal to 5 Hz or less, more preferably substantially equal to 3.5 Hz or less, most preferably substantially equal to 1 Hz.

In an embodiment the measurement system for measuring said residual vibrations is comprised in or fixedly connected to the projection module. Thus the actual position of the projection module relative to the target carrier is measured.

In an embodiment the measurement system comprises one or more interferometers for at least measuring said residual vibrations. Preferably the measurement system measures said residual vibrations as displacements of the projection module relative to the carrier along orthogonal axes of a Cartesian coordinate system.

In an embodiment the projection system is adapted for projecting said one or more beams onto the target while the projection module is moving relative to the frame. It is particularly important to substantially continuously provide highly accurate positioning of the target relative to the projection optics when a target is being moved relative to the projection optics of the projection module during projection of the beams on the target.

In an embodiment said projection module comprises a maskless multiple beam projection module for projecting said one or more beams onto said target, preferably during movement of said target relative to the frame.

In an embodiment said flexible coupling is adapted for retaining a substantially constant length. The distance of the projection optics from the target, at least in a Z-direction, thus remains substantially predictable and/or even substantially constant.

According to a second aspect the present invention provides a projection system for projecting one or more beams on a target, said projection system comprising:
 a frame,
 a projection module comprising a beam source for providing the one or more beams, and projection optics for projecting the one or more beams on the target, and
 a target positioning module, comprising a carrier for carrying the target, and a stage for carrying and positioning the carrier,
 a measurement system for determining a position of the projection module relative to the carrier, and
 a controller adapted for controlling the target positioning module to position the target under the projection module based on said determined position,
 wherein the projection module is connected to the frame via a flexible (slack) coupling for dampening the propagation of vibrations from said frame to said projection module, and wherein the controller is adapted control the target positioning module to compensate for residual vibrations as measured by said measurement system.

According to a third aspect the present invention provides a lithography system comprising a projection system according to any one of the preceding claims. Advantageously, in a lithography system according to the invention, the projection optics may be placed very close to the target, i.e. within micrometer distance thereof, for focusing said one or more beams onto the target. Preferably the lithograph system is a maskless lithography system comprising beam source for generating said one or more beams, a modulator array for individually modulating said one or more beams, and a focusing array, for individually focusing said one or more beams onto the target.

In an embodiment said one or more beams are writing beams for patterning the target, preferably wherein said beam source is a charged particle beam source.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1A:
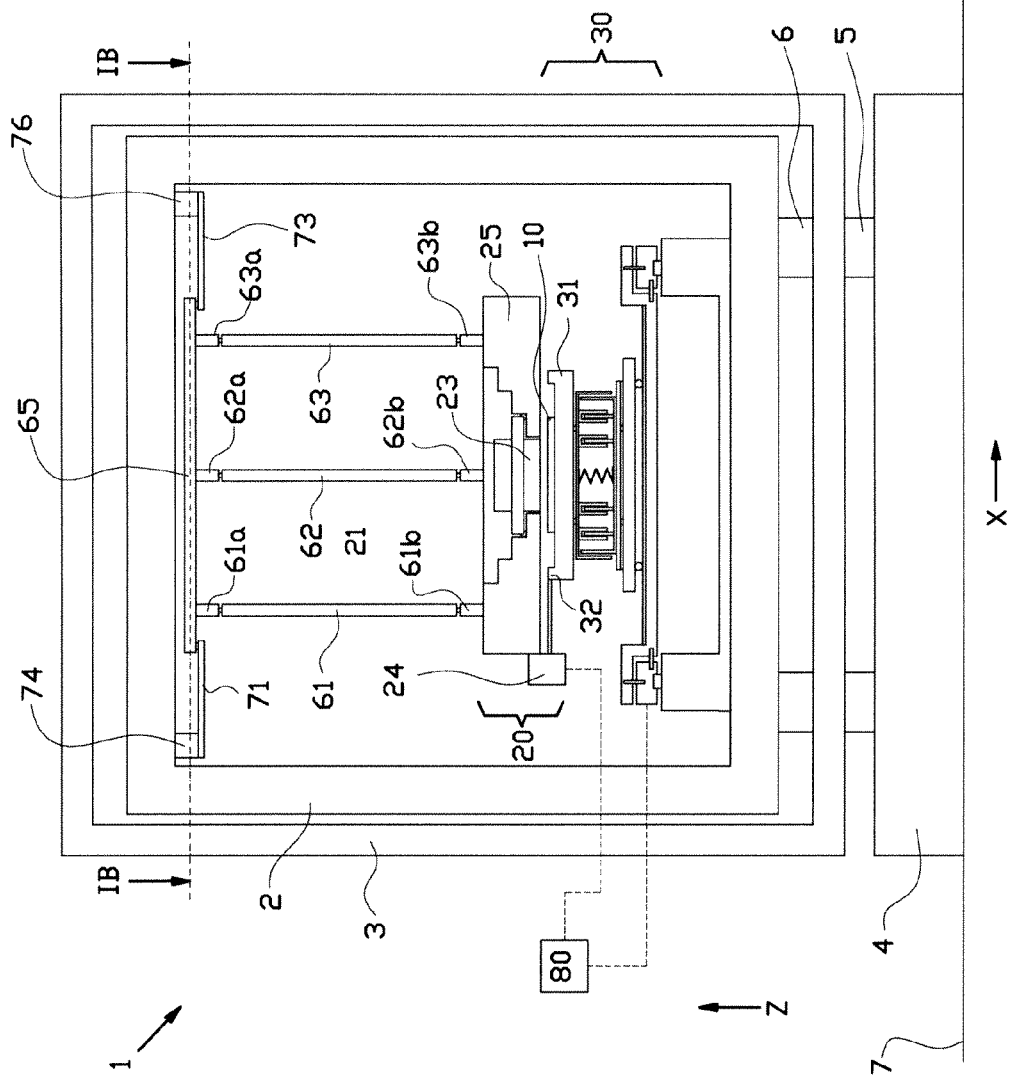
FIG. 1A schematically shows a side view of a projection system according to the invention.

FIG. 1A shows a side view of a projection system 1 according to the present invention. The projection system comprises a frame 2 which is arranged inside a vacuum chamber 3 and supports a target positioning module 30 adapted for accurately positioning a target 10 relative to projection module 20. The projection system 1 rests on a base plate 4 which substantially completely supports the projection system. The base plate 4 comprises a large concrete slab to reduce to propagation of high frequency vibrations from the floor 7 to the vacuum chamber 3, in particular to the frame 2 therein to which projection module 20 and target positioning module 30 are mounted. The vacuum chamber 3 is mounted on the base plate 4 via vibration isolators 5, and the frame 2 is mounted on the vacuum chamber 3 via vibration isolators 6.

The projection module 20 comprises a housing 25 which accommodates a charged particle beam source 21 for generating a plurality of charged particle beamlets (not shown), a modulator array 22, for selectively modulating individual ones of said plurality of charged particle beamlets, and projection optics 23, comprising a plurality of electrostatic lenses for focusing the beamlets onto a surface of the target 10.

The target positioning module 30 comprises a carrier 31 for carrying the target 10, which carrier 31 at an edge is provided with a reflective surface 32 for cooperating with measurement system 24 in the form of an interferometer 24 attached to the projection module 20. A position of the reflective surface 32 relative to the projection module 20 is measured by the interferometer 24 and passed on to a controller 80, here shown outside of the vacuum chamber 3. The controller 80 is adapted for controlling the target positioning module 30 to position the target 10 under the projection module 20 based on the determined position. Besides controlling the positioning module 30 to provide scanning movement of the target 10 relative to the projection module 20 along a direction X and along a direction Y perpendicular to said direction X, the controller 80 also controls the positioning module 30 to compensate for low frequency vibrations between the positioning module 30 and the projection module 20.

The projection module 20 is connected to the frame 2 via a flexible coupling comprising rods 61,62,63, first ends 61a, 62a,63a of which are connected to a plate 65. The plate 65 in turn is connected to spring leafs 71,72 (not shown),73 which are adapted to flex elastically along the direction Z, thus dampening at least some vibrations which travel from the frame 2 towards the projection module 20. The rods are connected at their second ends 61b, 62b, 63b to projection module housing 25. Each rod comprises a single piece aluminum rod provided with a first weakened portion near said first end 61a,62a,63a, and with a second weakened portion near said second ends 61b,62b,63b, such that the rods allow movement of the projection module relative to the frame substantially in a plane normal to the Z axis, but substantially constrain movement of the projection module relative to the frame along said Z-axis. The three rods 61,62,63 together form a pendulum suspension having a relatively low and substantially constant radial oscillation frequency. The controller 80 can control the target positioning system to move the target carrier 31 under the projection optics 23 based on the known radial oscillation frequency and the position and/or residual vibrations measured by the measurement system 24.

Figure 1B:
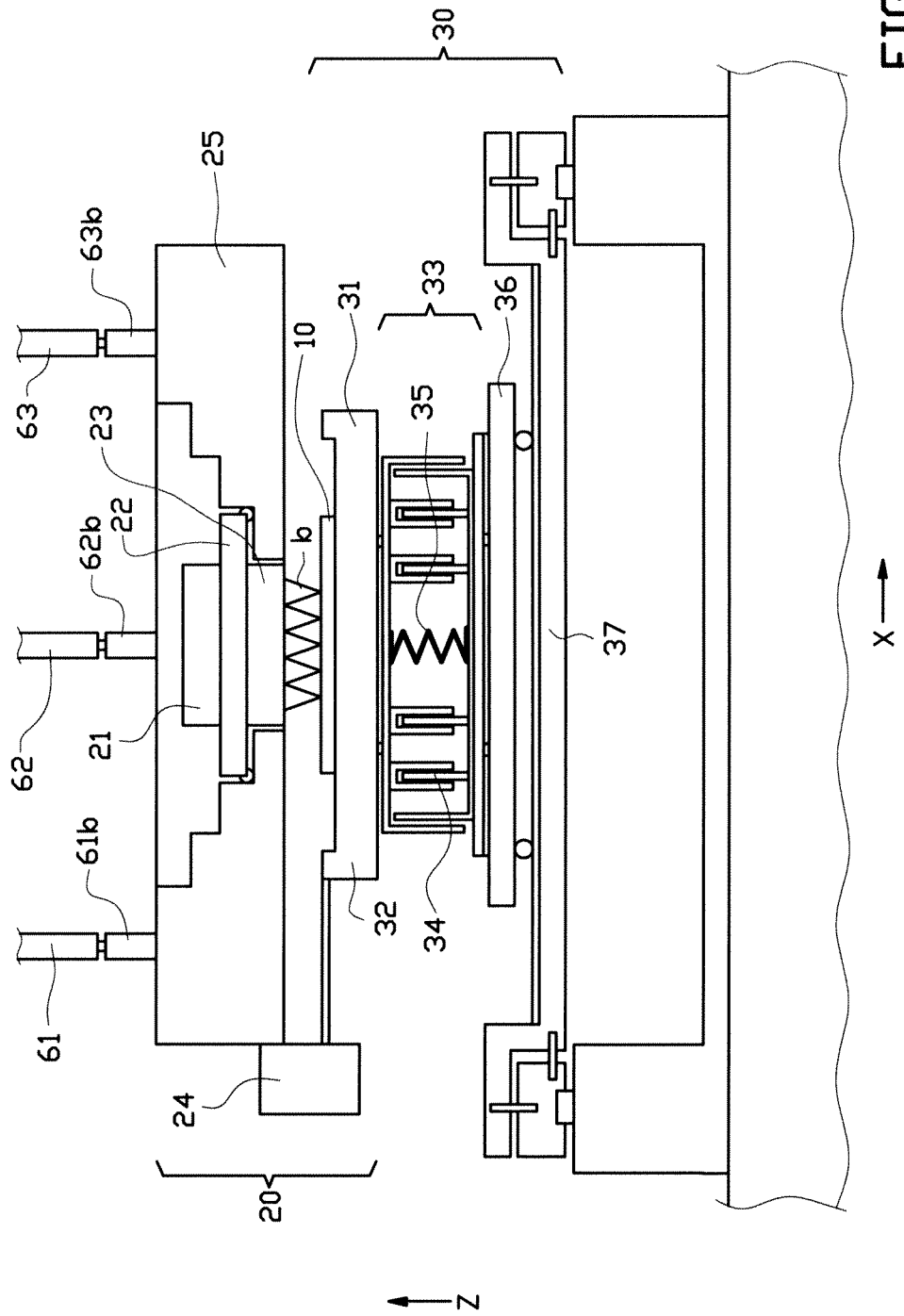
FIG. 1B shows a detail of FIG. 1A, showing the projection module and the target positioning module,
 FIG. 2 schematically shows a top view of the projection system of FIG. 1A through line IB-IB.

FIG. 1B shows the projection module 20 and positioning module 30 in more detail. The target positioning module 30 comprises a carrier 31 for carrying a target such as target 10, which carrier is arranged on a fine motion stage 33. The fine motion stage 33 is adapted for providing small corrections in position of the target carrier in 6 degrees of freedom, i.e. translation along and rotation about X,Y,Z to compensate for residual vibrations. The fine motion stage 33 comprises Lorentz motors 34, which allow accurate and fast positioning of the target carrier 31, and also provide further dampening of vibrations from the frame 2 to the target carrier 31. To reduce the load of the target 10 and target carrier 31 on the Lorentz motors, the fine motion stage 33 is provided with a load compensation spring 35.

The fine motion stage 33 is arranged on an x-stage 36 for displacing the fine motion stage 33 and the target carrier 31 and target 10 thereon along the X direction. The x-stage 36 in turn is arranged on a y-stage 37, for displacing the x-stage 36, fine motion stage 33, target carrier 31 and target 10 along the Y direction.

Because the fine motion stage 33 is adapted for six degree of freedom positioning of the target carrier 31 relative to x-stage 36, the controller 80 can control the fine motion stage such that a distance between the projection optics 23 and the target carrier 31 remains substantially constant, such that the projection of beams b on the target 10 remains substantially constant.

Figure 2:
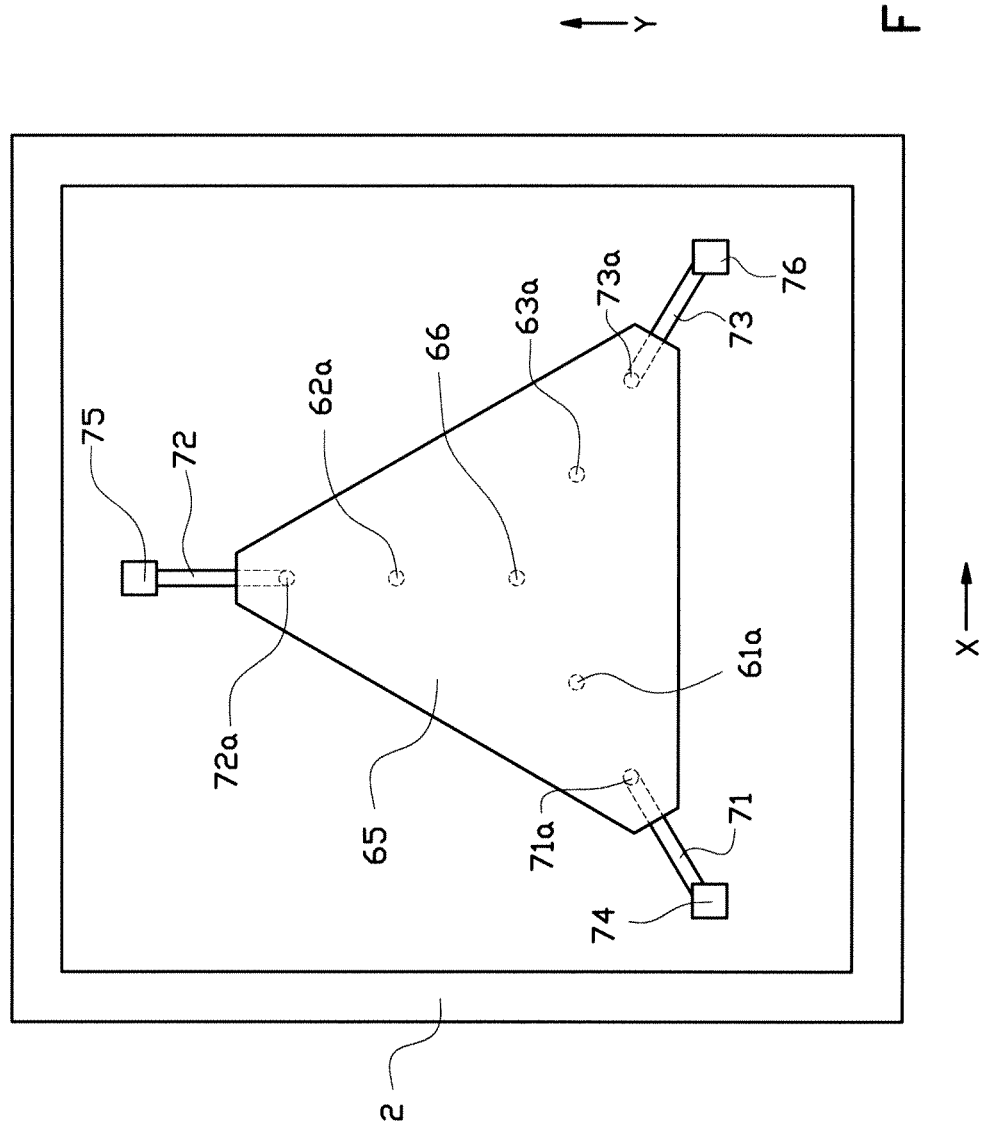

FIG. 2 shows a top view of the frame and interior thereof along line IB-IB of FIG. 1. Leaf springs 71,72,73 are connected with first ends to connection blocks 74,75,76 respectively, which connection blocks are statically connected to the frame 2. At opposite second ends 71a,72a,73a the leaf springs are connected to each other via substantially rigid plate 65, such that the leaf springs may exert a tensile force on one another. The leaf springs provide some freedom of motion for plate 65 along a direction normal to the X and Y directions, such that vibrations said normal direction may be dampened. Flexing of the coupling, i.e. of the rods 61,62,63 allows some movement of the projection module 20 (not shown) in a plane parallel to the XY plane.

The second ends 71a,72a,73a of the leaf springs are symmetrically arranged around a center point 66, which substantially coincides with a centre of mass of the projection module 20 when projected on the XY plane, such that the load exerted by the projection module 20 on the leaf springs 71,72,73 is substantially evenly distributed. Likewise, the first ends 61a, 62a,63a of the rods are attached to the plate 65 and are symmetrically arranged around the same center point 66. Though in the embodiment shown the plate 65 is connected to the frame via three leaf springs, any number and kind of dampening elements may be used instead.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Projection system (1) for projecting one or more beams on a target (10), said projection system comprising:
   a frame (2),
   a projection module (20) comprising a beam source (21) for providing the one or more beams (b), and projection optics for projecting the one or more beams on the target, and
   a target positioning module (30), comprising a carrier (31) for carrying the target, and a stage for carrying and positioning the carrier,
   a measurement system (24) for determining a position of the projection module (20) relative to the carrier (31), and
   a controller (80) adapted for controlling the target positioning module to position the target under the projection module based on said determined position,
   wherein the projection module (20) is connected to the frame (2) via a flexible coupling (61,62,63) for dampening the propagation of vibrations from said frame (2) to said projection module (20), wherein the projection module, which includes the beam source, is moveable with respect to the frame in a plane parallel to a target support surface of the carrier,
   wherein the controller (80) is adapted to control the target positioning module for moving the target relative to the frame (2) to compensate for residual vibrations as measured by said measurement system (24).

2. Projection system according to claim 1, wherein said flexible coupling (61,62,63) is slack along a horizontal plane for allowing movement of the projection module (20) relative to the target positioning module (30) along said horizontal plane.

3. Projection system according to claim 1, wherein said projection module is completely arranged below said flexible coupling.

4. Projection system according to claim 1, wherein said flexible coupling is suspended from said frame in a hanging fashion such that the optical module hangs free from said frame.

5. Projection system according to claim 1, wherein said flexible coupling comprises a flexible portion arranged inside said frame.

6. Projection system according to claim 1, wherein said projection module has a center of mass located closer to said target than to said frame.

7. Projection system according to claim 1, wherein said flexible coupling has a first predetermined length along its centerline, wherein said projection module has a second predetermined length along its center line parallel to said centerline of said flexible coupling, wherein said second predetermined length is smaller than said first predetermined length, at least by a factor 4.

8. Projection system according to claim 1, further comprising a vacuum chamber enveloping said frame, projection module, flexible coupling and target positioning module.

9. Projection system according to claim 1, wherein said flexible coupling is or comprises a slack coupling.

10. Projection system according to claim 1, wherein said flexible coupling is rigid along a direction perpendicular to said horizontal plane.

11. Projection system according to claim 1, wherein the flexible coupling is adapted for dampening high frequency vibrations, and wherein the controller is adapted to compensate for residual low frequency vibrations by controlling the target positioning module to move the carrier under the projection optics based on the residual vibrations measured by the measurement system.

12. Projection system according to claim 11, wherein the flexible coupling is adapted for dampening vibrations having a frequency equal to 3.5 Hz or more.

13. Projection system according to claim 1, wherein the carrier is uncoupled from vibrations from the frame to the carrier.

14. Projection system according to claim 13, wherein the target positioning module comprises Lorentz-motors for carrying and moving the carrier.

15. Projection system according to claim 1, wherein the target positioning module comprises a fine-motion stage on which the carrier is arranged, wherein the fine motion stage of the target positioning module is adapted for providing movement of the target relative to the stage in six degrees of freedom to compensate for said residual vibrations.

16. Projection system according to claim 1, further comprising dampeners for dampening vibrations from the frame to the flexible coupling and vice versa, wherein the flexible coupling is connected to the frame via said dampeners.

17. Projection system according to claim 16, wherein said dampeners comprise one or more leaf springs (73) arranged for bending within a plane normal to a carrying surface of the carrier.

18. Projection system according to claim 1, wherein the flexible coupling comprises a suspension.

19. Projection system according to claim 18, wherein said suspension comprises parallel suspension rods.

20. Projection system according to claim 19, wherein said suspension rods are each formed as a single piece.

21. Projection system according to claim 1, wherein said suspension is a pendulum suspension having a radial oscillation frequency, wherein said pendulum suspension is adapted for dampening propagation from the frame to the projection module of vibrations having higher frequencies than said radial oscillation frequency.

22. Projection system according to claim 21, wherein the radial oscillation frequency is equal to 3.5 Hz or less.

23. Projection system according to claim 1, wherein the measurement system for measuring said residual vibrations is comprised in or fixedly connected to the projection module.

24. Projection system according to claim 23, wherein the measurement system comprises one or more interferometers for at least measuring said residual vibrations.

25. Projection system according to claim 1, adapted for projecting said one or more beams onto the target while the projection module is moving relative to the frame.

26. Projection system according to claim 1, wherein said projection module comprises a maskless multiple beam projection module for projecting said one or more beams onto said target, preferably during movement of said target relative to the frame.

27. Projection system according to claim 26, wherein said beam source is a charged particle beam source for generating a plurality of charged particle beamlets, and wherein said projection module (20) comprises:

a housing (25), wherein said housing accommodates said charged particle beam source (21), a modulator array (22), for selectively modulating individual ones of said plurality of charged particle beamlets, and projection optics (23,) comprising a plurality of electrostatic lenses for focusing the beamlets onto a surface of the target (10).

28. Projection system according to claim 1, wherein said flexible coupling is adapted for retaining a constant length.

29. Lithography system comprising a projection system according to claim 2 or claim 1.

30. Lithography system according to claim 29, wherein said one or more beams are writing beams for patterning the target.

* * * * *